US006344969B1

(12) United States Patent
Lord et al.

(10) Patent No.: US 6,344,969 B1
(45) Date of Patent: Feb. 5, 2002

(54) SWITCHED MULTI-PORT COMMUNICATIONS DEVICE AND ASSOCIATED METHODS

(75) Inventors: Randal B. Lord; Robert M. Scharf, both of Melbourne, FL (US)

(73) Assignee: Stratos Lightwave, Chicago, IL (US)

( * ) Notice: Subject to any disclaimer, the term of this patent is extended or adjusted under 35 U.S.C. 154(b) by 0 days.

(21) Appl. No.: 09/333,462

(22) Filed: Jun. 15, 1999

Related U.S. Application Data

(63) Continuation of application No. 09/137,407, filed on Aug. 20, 1998, now Pat. No. 6,308,235, which is a continuation-in-part of application No. 09/098,277, filed on Jun. 16, 1998, now abandoned.

(51) Int. Cl.[7] .................................................. H05K 5/00

(52) U.S. Cl. ....................... 361/686; 361/754; 361/756; 439/610; 439/620

(58) Field of Search ......................... 361/686, 680–683, 361/725–727, 741, 754, 756; 439/490, 610, 620; 257/723, 724

(56) References Cited

U.S. PATENT DOCUMENTS

| | | | | | |
|---|---|---|---|---|---|
| 5,518,423 A | | 5/1996 | Green et al. | ................ | 439/610 |
| 5,647,767 A | | 7/1997 | Scheer et al. | ............... | 439/620 |
| 5,864,463 A | * | 1/1999 | Tsukada et al. | ............. | 361/686 |
| 5,876,240 A | * | 3/1999 | Derstine et al. | ............ | 439/490 |
| 5,915,993 A | * | 6/1999 | Belopolsky et al. | ........ | 439/490 |

OTHER PUBLICATIONS

Product Sheet H309.A, "Fastpulse High Speed LAN Transceivers", *Pulse*, (Jul. 1996), pp. 1–4.
Product Sheet MD6304 Series, "Quad 10/100BASE–TX Filtered Connector Module", *Valor Electronics, Inc.*, 1997.
Product Sheet MD6301 Series, "Single 10/100BASE–TX Filtered Connector Module", *Valor Electronics, Inc.*, 1997.
Data Sheet LXT915, "Simple Quad Ethernet Repeater", *Level One*, (Apr. 1997), pp. 1–21.

* cited by examiner

*Primary Examiner*—Leo P. Picard
*Assistant Examiner*—Hung Van Duong
(74) *Attorney, Agent, or Firm*—Steven M. Evans

(57) ABSTRACT

A switched communications device includes a multi-port jack housing having portions defining a plurality of recesses extending inwardly from the front for receiving respective mating plugs. Signal connectors are preferably positioned within each of the recesses and define respective communications ports. A circuit board is positioned within the multi-port jack housing and preferably extends adjacent the back. The switched communications device preferably includes at least one switched communications processor mounted on the circuit board and connected to the plurality of communications ports for processing inbound and outbound communications signals so that the signals are switched among the communications ports. A switched communications processor preferably communicates with two or more of the communications ports. The signal connectors may be electrical and/or optical, and may be compatible with an RJ-45 jack. An internal EMI shield may be provided in the circuit board.

40 Claims, 5 Drawing Sheets

*Fig. 6*
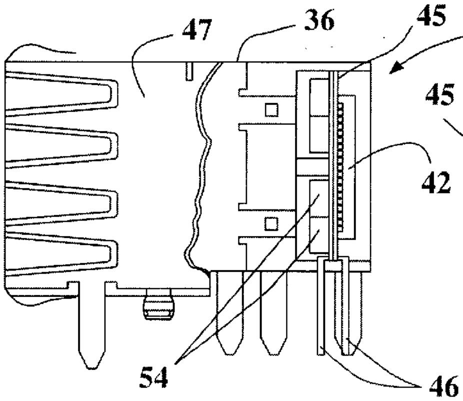
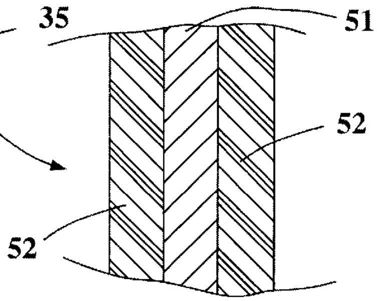
*Fig. 7*
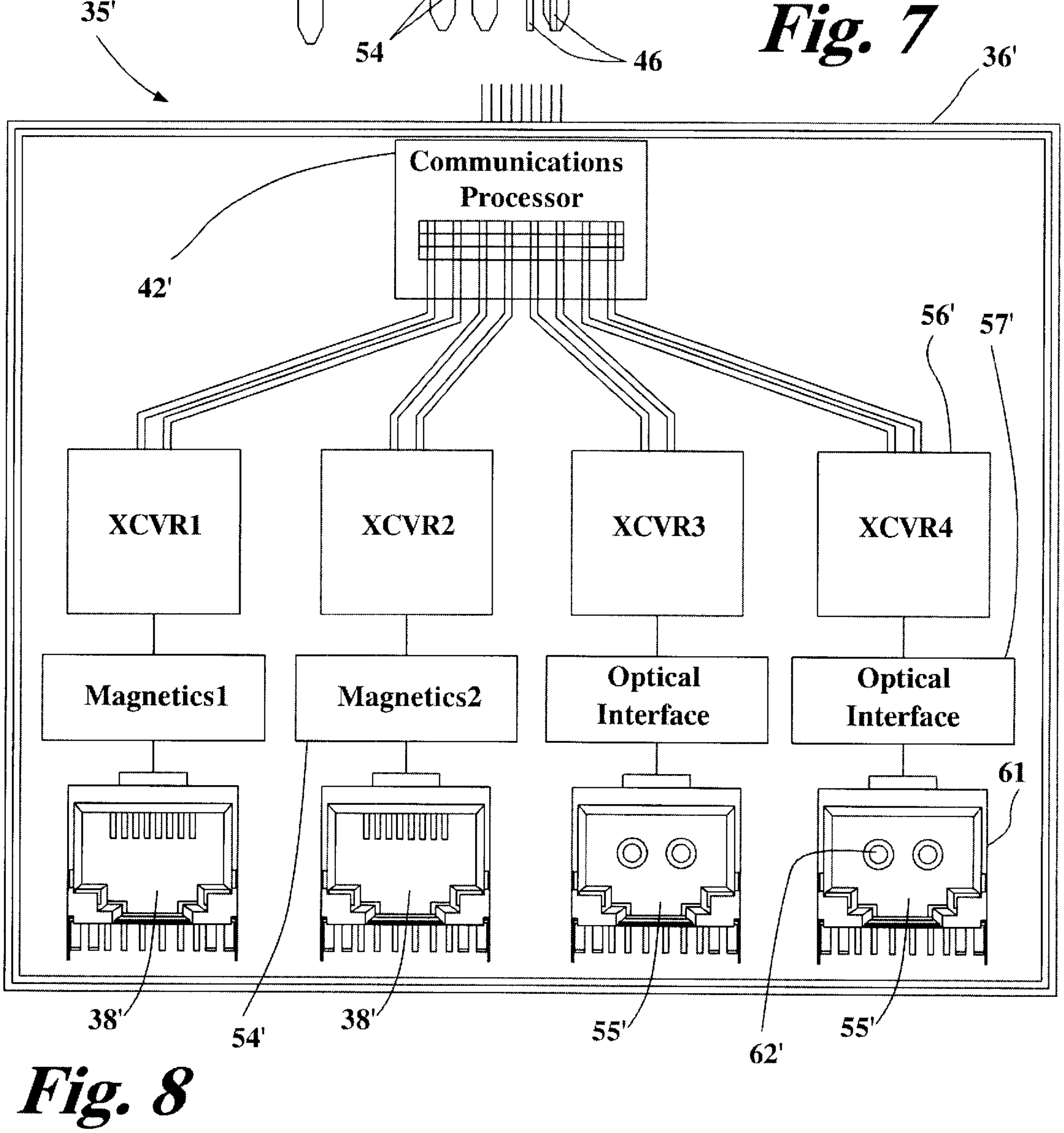
*Fig. 8*

SWITCHED MULTI-PORT COMMUNICATIONS DEVICE AND ASSOCIATED METHODS

RELATED APPLICATION

The present application is a continuation of U.S. patent application Ser. No. 09/137,407 filed Aug. 20, 1998 now U.S. Pat. No. 6,308,235 dated Oct. 23, 2001 which, in turn, is a continuation-in-part of U.S. patent application Ser. No. 09/098,277 filed Jun. 16, 1998 abandoned.

FIELD OF THE INVENTION

The present invention relates to the field of communications electronics, and, more particularly, to a switched communications device and related methods.

BACKGROUND OF THE INVENTION

Digital communications over twisted copper wire pairs, or optical fiber pairs, are widely used for Local Area Networks (LANs), for example. The LAN typically connects multiple computer users to a server or other computer. A LAN transceiver, that is, a combination transmitter and receiver, is typically used to transmit data and receive data over the twisted pair or fiber pair.

A typical LAN 15 as in the prior art is shown in FIG. 1. The LAN 15 includes a pair of servers 16 connected to a plurality of user workstations 21. A hub 17 is connected on one side to the servers 16, and on the other side to the workstations 21. The hub 17 includes signal transceivers and associated circuitry for processing the signals between the servers 16 and workstations 21.

A simplified prior art hub 17 with the overall housing removed for clarity is shown in FIG. 2. More particularly, the illustrated hub 17 includes a modular jack connector 22, which, in turn, may provide twelve ports 22*a* for connection to up to twelve workstations 21. A series of electrical conductors, not shown, are carried within each recess of the modular jack connector 22 and engage mating conductors on the corresponding jack or plug. One common port arrangement provides compatibility with a so-called "RJ-45" jack. Optical ports, such as including an optical detector and optical emitter, are also commonly used to establish inbound and outbound signal paths.

The modular jack connector 22 is mounted onto a mother circuit board 24. The mother circuit board 24 also illustratively mounts three communications processors 26, such as may be provided by available integrated circuit packages. In addition, the mother board 24 illustratively mounts associated magnetic devices 27 for coupling to twisted wire pairs, for example. The magnetic devices 27 are typically small transformers.

The communications processor IC's 26 may be integrated quad-port repeaters such as the Model LXT915 available from Level One of Sacramento, Calif. Each of the communications processors 26 includes four transceivers for connection to four respective ports 22*a*. The communications processor IC's establish switched communications among the connected ports. Alternately, the communications processors may be integrated quad transceivers providing switched communication between ports. For example, each communications processor may be a Model AH104-QF ethernet transceiver available from Adhoc Technologies of San Jose, Calif.

The mother circuit board 24 would also typically mount a number of other components, not shown, such as for supplying power, providing various status indications, etc. An overall housing, not shown, would also typically be provided to protect the mother board 24 and other components. The hub 17 is typically a relatively bulky and expensive piece of equipment.

Board-mounted shielding would typically be needed to shield the communications processors 26 from the magnetic devices 27. The magnetic devices 27 typically generate electromagnetic interference (EMI), and the communications processors 26 are typically susceptible to EMI. The housing may be made of an electrical conductor, to provide an overall EMI shield.

Another disadvantage of prior art LANs including one or more conventional hubs 17, is that the hubs are separate pieces of equipment from the servers 16. The hubs 17 need to be purchased, installed and maintained. In other words, the hubs 17 add cost and complexity, and may reduce the overall reliability of the LAN 15.

SUMMARY OF THE INVENTION

In view of the foregoing background, it is therefore an object of the present invention to provide a switched communications device and associated method wherein the functions of a conventional hub can be provided in a more compact and convenient device, such as to be integrated in another device, to thereby reduce cost and increase reliability.

It is another object of the invention to provide such a switched communications device and associated method which is also resistant to EMI and which can be readily compatible with existing RJ-45 jacks and plugs.

These and other objects, features and advantages in accordance with the present invention are provided by a switched communications device comprising, in one embodiment, a multi-port jack housing having a front and a back, and including portions defining a plurality of recesses extending inwardly from the front for receiving respective mating plugs therein. Signal connector means are preferably positioned within each of the recesses and define a respective plurality of communications ports. Of course, each communications port establishes inbound and outbound signal paths with a respective mating plug. A circuit board is positioned within the multi-port jack housing and preferably extends adjacent the back thereof.

In addition, the switched communications device preferably includes at least one switched communications processor mounted on the circuit board and connected to the plurality of communications ports for processing inbound and outbound communications signals so that the signals are switched among the communications ports. In other words, the at least one switched communications processor preferably communicates with two or more of the communications ports in a switched fashion so that signals appear at the connected communications ports. Accordingly, an extremely compact switched communications multi-port device is provided.

Two or more of the plurality of recesses may be positioned in side-by-side relation. In one particularly advantageous embodiment, the recesses are arranged in two tiers, with each tier comprising two or more recesses arranged in sideby-side relation. In addition, a respective switched communication processor may be provided for each group of four communications ports. Each switched communications processor preferably includes an integrated circuit. Each switched communications processor also preferably includes a plurality of transceivers for a corresponding group of communications ports.

Another important aspect of the invention relates to shielding. More particularly, the circuit board preferably comprises an electrically conductive layer defining a first internal electromagnetic interference (EMI) shield. In embodiments wherein a plurality of switched communications processors are used, these are all preferably positioned on a first side of the circuit board. Moreover, EMI generating devices, such as circuit magnetics, are preferably positioned on the second side of the circuit board. Accordingly, a compact arrangement is facilitated without compromising performance caused by EMI.

Also relating to EMI, the switched communications device may preferably include an electrically conductive layer on outer surface portions of the multi-port jack housing defining an external EMI shield. This external EMI shield may be connected to the internal EMI shield.

There is a large installed base of existing communications ports and equipment compatible with the RJ-45 jack. Accordingly, in the switched communications device according to the invention each of the communications ports is preferably compatible with the RJ-45 jack.

The signal connector means may comprise a plurality of electrical contacts, such as for twisted pair links. Alternately, the signal connector means may be optical and comprise an optical detector for inbound optical signals, and an optical emitter for outbound optical signals. Mixes of both formats may be provided in the communications device.

Another aspect of the invention relates to a method for making a switched communications device comprising a multi-port jack housing having a front and a back, and including portions defining a plurality of recesses extending inwardly from the front for receiving respective mating plugs therein. The method preferably comprises the steps of: positioning signal connector means within each of the recesses and defining a respective plurality of communications ports, each communications port for establishing inbound and outbound signal paths with a respective mating plug; mounting at least one switched communications processor on a circuit board and connected to the plurality of communications ports for processing inbound and outbound communications signals so that signals are switched among the ports; and positioning the circuit board within the multi-port jack housing and extending adjacent the back thereof.

BRIEF DESCRIPTION OF THE DRAWINGS

FIG. 6 is a fragmentary side view of the switched communications device as shown in FIG. 3.

FIG. 7 is a greatly enlarged cross-sectional view of the circuit board in the switched communications device as shown in FIG. 3.

FIG. 8 is a schematic diagram of a second embodiment of the switched communications device in accordance with the present invention.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. Prime and double prime notation is used to indicate similar elements in alternate embodiments.

Figure 1:
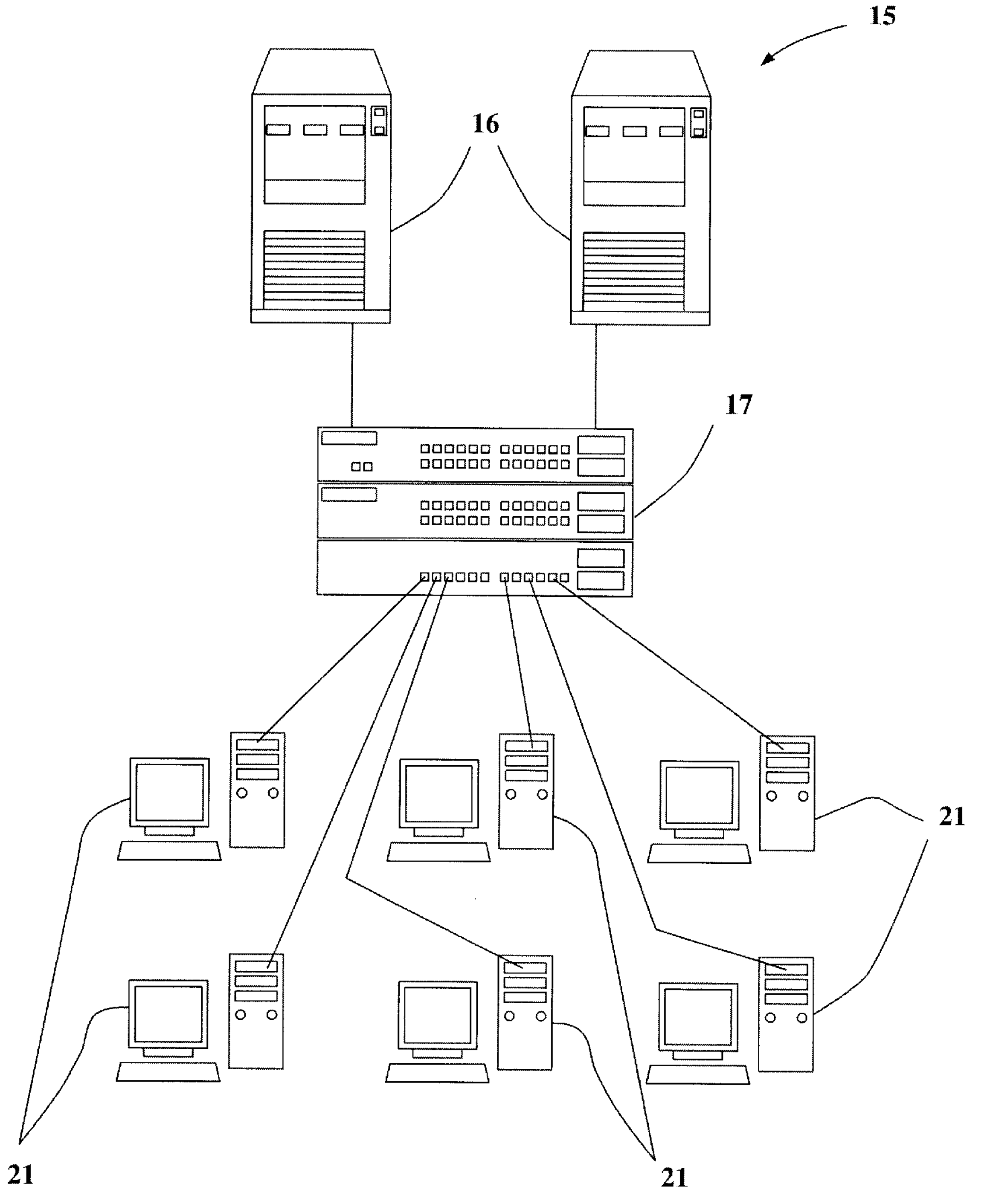
Fig. 1 (PRIOR ART)
FIG. 1 is a schematic diagram of a typical LAN as in the prior art.
Figure 2:
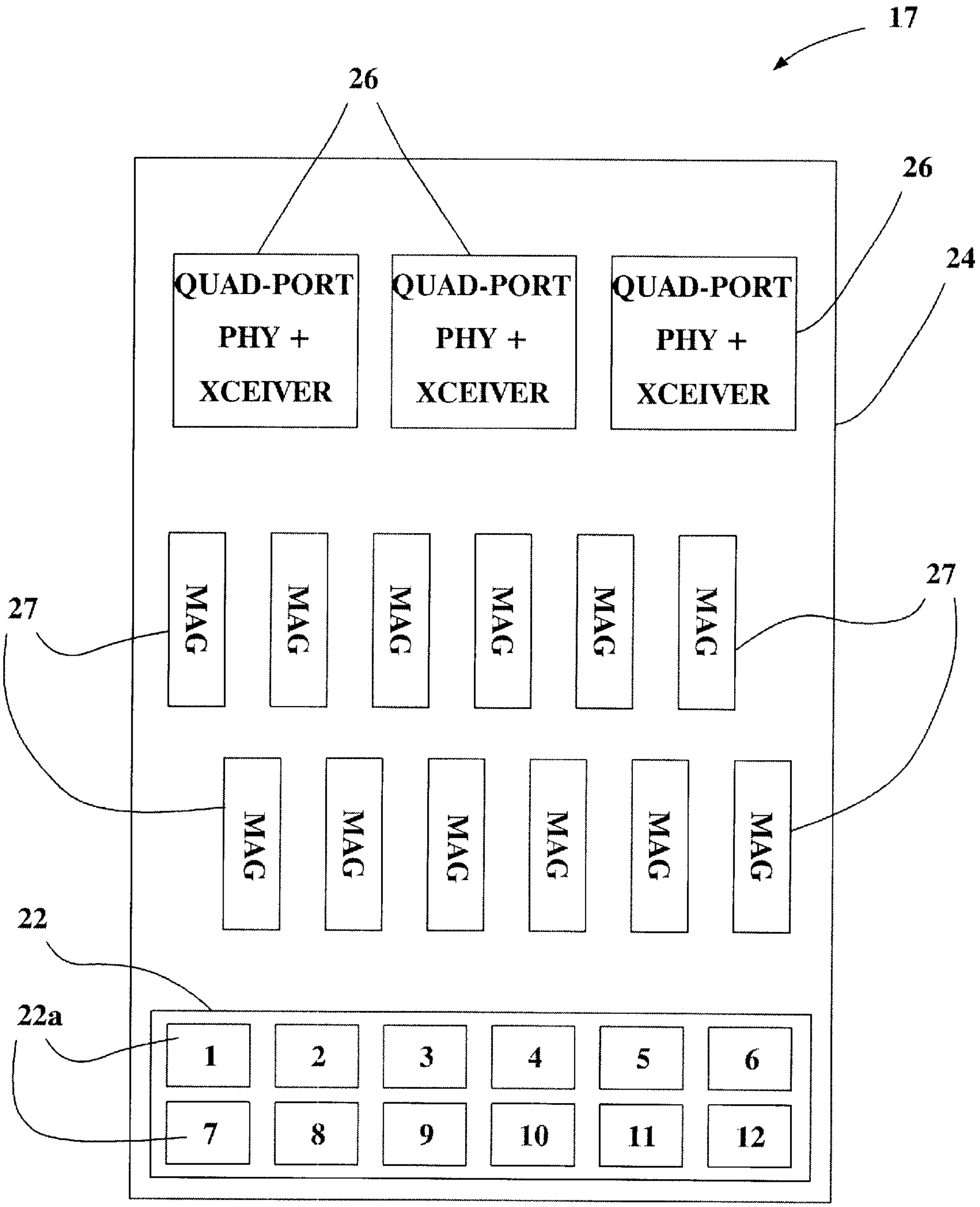
Fig. 2 (PRIOR ART)
FIG. 2 is a schematic plan view of a mother circuit board and related components mounted thereon in a hub as in the prior art and used in the LAN of FIG. 1.
Figure 3:
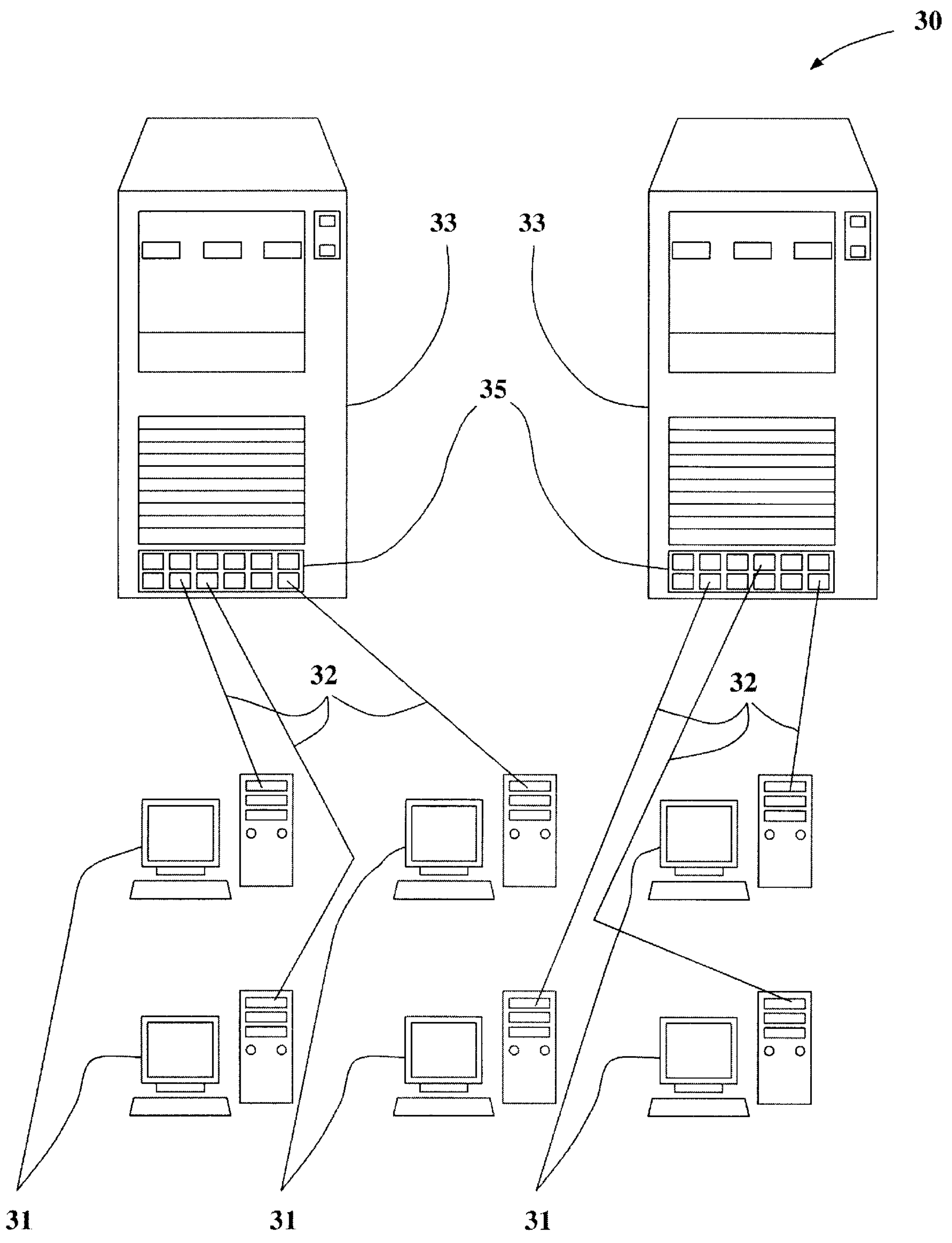
FIG. 3 is a schematic diagram of a LAN including a server equipped with a switched communications device in accordance with the present invention.
Figure 4:
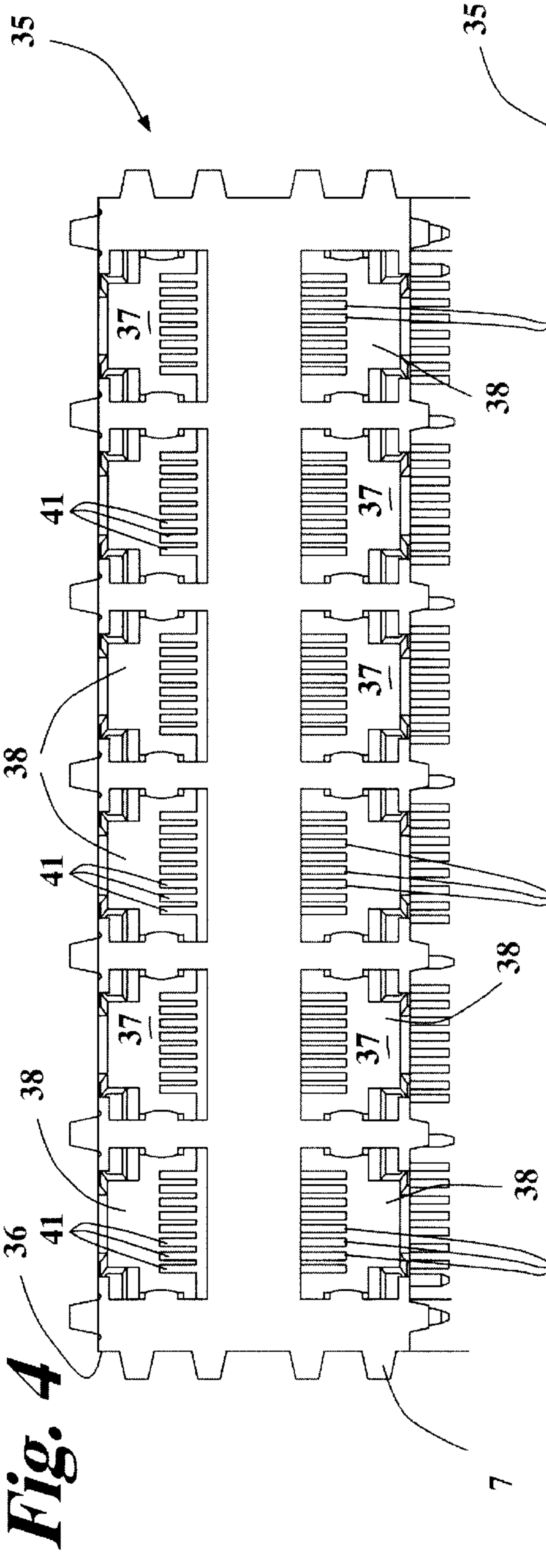
FIG. 4 is a front view of the switched communications device as shown in FIG. 3.

Referring initially to FIGS. 3–7, a first embodiment of a switched communications device 35 in accordance with the invention will now be described. As shown in FIG. 3, the switched communications device 35 may advantageously be incorporated into a server 33, which, in turn, is part of a LAN 30. As shown in the illustrated embodiment, the LAN 30 interconnects a plurality of user workstations 31.

Twisted pair lines 32 may connect the workstations 31 to the respective ports of the respective switched communications devices 35. Of course, as will be readily appreciated by those skilled in the art, fiber cables may be used to connect the workstations, or a mixture of fiber and twisted pair lines may be used.

In addition, although the switched communications device 35 is shown incorporated into a server 33, it may also be advantageously incorporated in other computer devices. The switched communications device 35 may be used, for example, in an integrated cable TV modem and Ethernet hub, as will also be readily appreciated by those skilled in the art. Other applications are also contemplated by the invention.

The switched communications device 35 includes a multi-port jack housing 36 having a front and a back, and including portions defining a plurality of recesses 37 extending inwardly from the front for receiving respective mating plugs, not shown. The multi-port jack housing 36 may be integrally molded plastic, for example, as will be readily understood by those skilled-in the art. In the illustrated embodiment, six recesses 37 are positioned in side-by-side relation, and two tiers of such recesses are provided. Any number of recesses 37 may be provided as explained in greater detail below. The illustrated twelve-port arrangement provides a relatively compact, yet readily manufactured embodiment of the switched communications device 35. This arrangement provides a relatively high port density and is also rugged and reliable when formed using conventional plastic molding techniques.

Signal connector means are preferably positioned within each of the recesses 37 and define a respective plurality of communications ports 38. In the illustrated embodiment, a plurality of biased electrical contacts 41 are provided. The arrangement of the contacts 41 and the size and configuration of the recesses 37 are compatible with the ubiquitous RJ-45 jack, which is commonly used in LAN and other communications applications as will be readily understood by those skilled in the art. Other configurations of electrical contacts are also contemplated by the present invention. Each communications port 38 establishes inbound and outbound signal paths with a respective mating plug.

Figure 5:
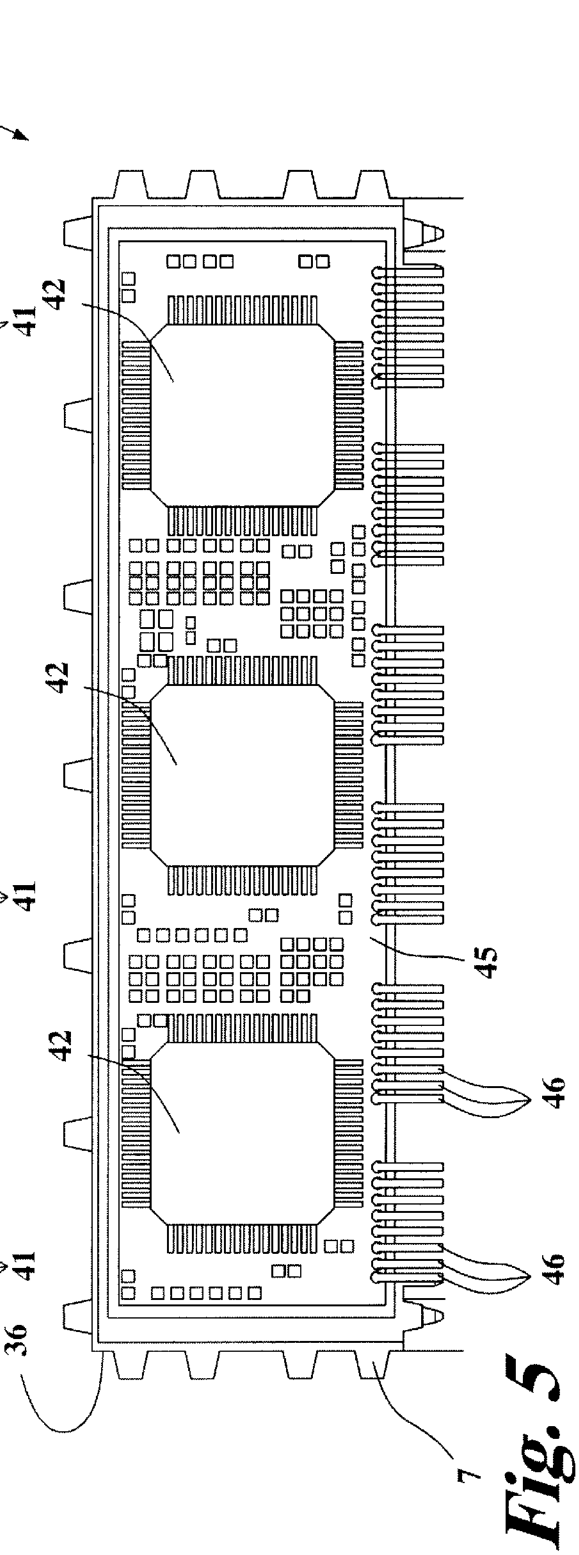
FIG. 5 is a rear view of the switched communications device as shown in FIG. 3, with the rear housing portion removed.

A relatively compact circuit board 45 is illustratively positioned within the multi-port jack housing 36 and extends across the entire back thereof as shown best in FIG. 5. Morever, the switched communications device 35 includes three switched communications processors 42 mounted on the circuit board and connected to the plurality of communications ports 38 for processing inbound and outbound communications signals so that the signals are switched among the ports. Each switched communications processor 42 communicates with four communications ports 38 in the illustrated embodiment. In other embodiments, other numbers of ports 38 can be handled by each processor. Accordingly, an extremely compact multi-port device is provided.

Each switched communications processor 42 may be provided, for example, by a commercially available integrated circuit offered by Adhoc Technologies of San Jose, Calif., under the designation AH104-QF. The switched communications processor 42 includes a plurality of transceivers for a corresponding group of communications ports 38. In the past, such ICs were positioned on relatively large and bulky mother boards as part of a hub as described above in the Background of the Invention section. In accordance with the present invention, the considerable signal processing capability of the IC is provided within the compact multi-port housing 36. Accordingly, the switched communications device 35 may be connected to a mother circuit board, such as of the server 33 (FIG. 3), or other similar computer device. A separate hub may then not be needed. Thus, the initial purchase cost, and maintenance costs may be less. In addition, the LAN 30 will be simpler and more robust.

Although the switched communications processors 42 are shown as integrated circuit packages, that is, with an integrally molded plastic covering and outwardly extending leads, the processors may also be provided by the individual circuit die without the package. In other words, the circuit board 45 may mount the individual integrated circuit die as will be readily appreciated by those skilled in the art. Mounting the individual circuit die requires considerable less surface area on the circuit board 45, which is necessarily relatively limited because of the compact dimensions of the multi-port housing 36 to be compatible with the RJ-45 jacks.

A plurality of pins 46 extend outwardly from the bottom edge of the circuit board 45 as shown in FIG. 5. These pins 46 can be inserted into corresponding openings in a circuit board to which the switched communications device 35 is attached, such as the mother board of the server.

The switched communications device 35 also illustratively includes a metal or other conductive layer 47 which covers the outer surface portions of the multi-port housing 36 to thereby provide an EMI shield. Accordingly, adjacent components will not interfere with the circuitry within the housing 36, and conversely, EMI will not be radiated outwardly from the housing. As would be readily understood by those skilled in the art, a back panel covers the circuit board 45. In addition, the outer EMI shield 47 would also include portions which cover the back panel.

Referring now more particularly to FIGS. 6 and 7, another important aspect of the present invention relates to internal EMI shielding. The circuit board 45 illustratively comprises an electrically conductive layer 51 between two dielectric layers 52. Of course, the circuit board 45 may also include other layers as will be appreciated by those skilled in the art. The electrically conductive layer 51 defines an internal electromagnetic interference (EMI) shield. The electrically conductive layer 47 which defines the external EMI shield may be connected to the electrically conductive layer 51 which defines the internal EMI shield. In embodiments including a plurality of switched communications processors 42, these are all preferably positioned on a first side of the circuit board 45. In the illustrated embodiment, the processors 42 are positioned adjacent the back of the multi-port housing 36. The position could be reversed in other embodiments.

EMI generating devices, such as the illustrated circuit magnetics 54, are positioned on the second side of the circuit board 45. In embodiments of the switched communications device 35 including only a single communications processor 42, the magnetics 54 or other EMI generating devices are preferably on the opposite side from the processor. Accordingly, a compact arrangement is facilitated without compromising performance caused by EMI.

A second embodiment of the switched communications device 35' is schematically illustrated in FIG. 8. In this embodiment two twisted pair ports 38' are provided, and two optical ports 55' are provided. The switched communications processor 42' is connected to four transceivers 56'. In other embodiments, the transceivers 56' may be part of the integrated circuit of the processor. Magnetics 54' are provided for interfacing the twisted pair ports 38'. Optical interfaces 57' are provided for interfacing the transceivers 56' to the optical ports 55'.

Considering now in greater detail the optical ports 56', each such port includes an optical detector 61' for inbound optical signals and an optical emitter 62' for outbound optical signals. Considered in slightly different terms, the optical detector 61' and optical emitter 62' provide the signal connector means.

This second embodiment illustrates a mix of both optical and twisted pair ports, and those of skill in the art will recognize that the ports can also be all optical or all twisted pair, for example, in other embodiments. The optical detector 61' and optical emitter 62' may be provided by any of a number of commercially available devices as will be readily appreciated by those skilled in the art. The switched communications device 35' includes a multi-port housing 36', circuit board mounting arrangement, and EMI shields as described above with reference to the embodiment as shown in FIGS. 3–7.

The circuitry mounted within the compact multi-port housing 36' performs the following functions: encodes and serializes the outgoing data, decodes and deserializes the incoming data, and synchronizes data flowing to and from the ports to the system bus timing. In addition, all digital-to-analog conversion is accomplished for the outgoing signals, analog-to-digital conversion is performed for the incoming signals, the impedance to each line is matched, and isolation is provided against external over voltage/over current conditions. All of these functions are performed by the switched communications device 35' having the same or similar size as only the molded connector body of prior art hubs.

Another aspect of the invention relates to a method for making a switched communications device 35 comprising a multi-port jack housing 36 having a front and a back, and including portions defining a plurality of recesses 37 extending inwardly from the front for receiving respective mating plugs therein. The method preferably comprises the steps of: positioning signal connector means within each of the recesses 37 and defining a respective plurality of communications ports 38, each communications port for establishing inbound and outbound signal paths with a respective mating plug; mounting at least one switched communications processor 42 on a circuit board 45 and connected to the plurality of communications ports for processing inbound and outbound communications signals so that the signals are switched among the ports; and positioning the circuit board within the multi-port jack housing and extending adjacent the back thereof.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A switched communications device, comprising:

a multi-port jack housing having a front and a back, and a plurality of recesses extending inwardly from the front for receiving respective mating plugs therein;

signal connector means within each of the recesses and defining a respective plurality of communications ports, each communications port for establishing inbound and outbound signal paths with a respective mating plug;

a circuit board within said multi-port jack housing and extending adjacent the back thereof; and an integrated circuit switched communications processor mounted on said circuit board and connected to said plurality of communications ports for processing inbound and outbound communications signals so that the signals are switched among the plurality communications posts.

2. The switched communications device according to claim 1, wherein said integrated circuit switched communications processor comprises means for communicating with two or more of said communication ports.

3. The switched communications device according to claim 1, further comprising:

a second integrated switched communications processor mounted on said circuit board and connected to a plurality of communication ports for processing inbound and outbound communications signals.

4. The switched communications device according to claim 1, wherein two or more of the plurality of recesses are positioned in side-by-side relation.

5. The switched communications device according to claim 1, wherein the plurality of recesses are arranged in two tiers, with each tier comprising two or more recesses arranged in side-by-side relation.

6. The switched communications device according to claim 1, wherein said integrated circuit switched communications processor comprises a plurality of transceivers for a corresponding group of communications ports.

7. The switched communications device according to claim 1, wherein said circuit board comprising an electrically conductive layer defining a first internal electromagnetic interference (EMI) shield.

8. The switched communications device according to claim 1, wherein each of said communications ports is compatible with an RJ-45 jack.

9. The switched communications device according to claim 1, wherein said signal connector means comprises a plurality of electrical contacts.

10. The switched communications device according to claim 1, wherein said signal connector means comprises:

an optical detector for inbound optical signals; and an optical emitter for outbound optical signals.

11. The switched communications device according to claim 3, wherein each of said first and second integrated circuit switched communications processors is connected to two or more of said communication ports.

12. The switched device according to claim 7, wherein said integrated circuit switched communications processor comprises a plurality of integrated circuit switched communications processors all positioned on a first side of said circuit board.

13. The switched communications device according to claim 7, further comprising an electrically conductive layer on outer surface portions of said multi-port jack housing defining an external EMI shield.

14. The switched communications device according to claim 7, further comprising at least one EMI generating device positioned on a second side of said circuit board opposite the first side.

15. The switched communications device according to claim 13, wherein said first internal EMI shield is electrically connected to said external EMI shield.

16. The switched communications device according to claim 14, wherein said EMI generating device comprises at least one magnetic device.

17. A switched communications device, comprising:

a multi-port jack housing including portions defining a plurality of recesses extending inwardly for receiving respective mating plugs therein;

a signal connector means within each of the recesses and defining a respective plurality of communications ports, each communications port for establishing inbound and outbound signal paths with a respective mating plug;

a circuit board within said multi-port jack housing, said circuit board comprising an electrically conductive layer defining a first internal electromagnetic interference (EMI) shield;

an integrated circuit switched communications processor mounted on said circuit board on a first side thereof and connected to said plurality of communications ports for processing inbound and outbound communications signals so that the signals are switched among the plurality of communications ports; and at least one EMI generating device positioned on a second side of said circuit board opposite the first side.

18. The switched communications device according to claim 17, wherein said multi-port jack housing has a front and a back;

wherein the recesses extend inwardly from the front of the multi-port jack housing; and wherein the circuit board extends across the back of the multi-port jack housing.

19. The switched communications device according to claim 17, wherein said integrated circuit switched communications processor comprises means for communicating with two or more of said communications ports.

20. The switched communications device according to claim 17, wherein said integrated circuit switched communications processor comprises a plurality of integrated circuit switched communications processors all mounted on the first side of the circuit board.

21. The switched communications device according to claim 17, wherein two or more of the plurality of recesses are positioned in side-by-side relation.

22. The switched communications device according to claim 17, wherein the plurality of recesses are arranged in two tiers, with each tier comprising two or more recesses arranged in side-by-side relation.

23. The switched communications device according to claim 17, wherein said integrated circuit switched communications processor comprises a plurality of transceivers for a corresponding group of communication ports.

24. The switched communications device according to claim 17, further comprising an electrically conductive layer on outer surface portions of said multi-port jack housing defining an external EMI shield.

25. The switched communications device according to claim 17, wherein said at least one EMI generating device comprises at least one magnetic device.

26. The switched communications device according to claim 17, wherein each of said communications ports is compatible with an RJ-45 jack.

27. The switched communications device according to claim 20, wherein each of said plurality of integrated circuit communications processors is connected to two or more of said communications ports.

28. The switched communications device according to claim 24, wherein said first internal EMI shield is electrically connected to said external EMI shield.

29. A switched communications device comprising:

a multi-port housing including portions defining a plurality of recesses extending inwardly for receiving respective mating plugs therein, the recesses being arranged in two tiers with each tier comprising two or more recesses arranged in side-by-side relation;

signal connector means within each of the recesses and defining a respective plurality of communications ports, each communications port for establishing inbound and outbound signal paths with a respective mating plug;

a circuit board within said multi-port jack housing; and an integrated circuit switched communications processor mounted on said circuit board and connected to said plurality of communications signals so that the signals are switched among the plurality of communications ports.

30. The switched communications device according to claim 29, wherein said multi-port jack housing has a front and a back;

wherein the recesses extend inwardly from the front of the multi-port jack housing; and wherein the circuit board extends across the back of the multi-port jack housing.

31. The switched communications device according to claim 29, wherein said integrated circuit switched communications processor comprises means for communicating with two or more of said communications ports.

32. The switched communications device according to claim 29, wherein said integrated circuit switched communications processor comprises a plurality of transceivers for a corresponding group of communication ports.

33. The switched communications device according to claim 29, wherein said circuit board comprises an electrically conductive layer defining a first internal electromagnetic interference (EMI) shield.

34. The switched communications device according to claim 29, further comprising an electrically conductive layer on outer surface portions of said multi-port jack housing defining an external EMI shield.

35. The switched communications device according to claim 29, wherein each of said communications ports is compatible with an RJ-45 jack.

36. The switched communications device according to claim 29, wherein said signal connector means comprises a plurality of electrical contacts.

37. The switched communications device according to claim 29, wherein said signal connector means comprises:

an optical detector for inbound optical signals; and an optical emitter for outbound optical signals.

38. The switched communications device according to claim 33, wherein said integrated circuit switched communications processor comprises a plurality of integrated circuit switched communications processors all positioned on a first side of said circuit board.

39. The switched communications device according to claim 33, further comprising at least one EMI generating device positioned on a second side of said circuit board opposite the first side.

40. The switched communications device according to claim 39, wherein said at least one EMI generating device comprises at least one magnetic device.

* * * * *